US007636867B2

(12) United States Patent
Abe

(10) Patent No.: US 7,636,867 B2
(45) Date of Patent: Dec. 22, 2009

(54) MEMORY SYSTEM WITH HOT SWAPPING FUNCTION AND METHOD FOR REPLACING DEFECTIVE MEMORY MODULE

(75) Inventor: Takashi Abe, Tokyo (JP)

(73) Assignee: NEC Corporation (JP)

( * ) Notice: Subject to any disclaimer, the term of this patent is extended or adjusted under 35 U.S.C. 154(b) by 521 days.

(21) Appl. No.: 11/387,951

(22) Filed: Mar. 24, 2006

(65) Prior Publication Data

US 2006/0218451 A1 Sep. 28, 2006

(30) Foreign Application Priority Data

Mar. 24, 2005 (JP) .............................. 2005-086814

(51) Int. Cl.
*G06F 11/00* (2006.01)
(52) U.S. Cl. .......................................... 714/7; 710/302
(58) Field of Classification Search ........................ None
See application file for complete search history.

(56) References Cited

U.S. PATENT DOCUMENTS

| | | | | | |
|---|---|---|---|---|---|
| 4,914,625 | A | * | 4/1990 | Billian | 714/2 |
| 6,038,680 | A | * | 3/2000 | Olarig | 714/6 |
| 6,047,343 | A | * | 4/2000 | Olarig | 710/302 |
| 6,401,157 | B1 | * | 6/2002 | Nguyen et al. | 710/302 |
| 6,651,138 | B2 | * | 11/2003 | Lai et al. | 711/115 |
| 6,715,104 | B2 | * | 3/2004 | Imbert de Tremiolles et al. | 714/25 |
| 6,766,469 | B2 | * | 7/2004 | Larson et al. | 714/7 |
| 6,785,785 | B2 | * | 8/2004 | Piccirillo et al. | 711/157 |
| 6,854,070 | B2 | * | 2/2005 | Johnson et al. | 714/5 |
| 7,035,953 | B2 | * | 4/2006 | Krontz et al. | 710/302 |
| 7,076,686 | B2 | * | 7/2006 | La Fetra | 714/6 |
| 7,194,581 | B2 | * | 3/2007 | Vogt | 711/131 |
| 7,350,089 | B2 | * | 3/2008 | Mundada et al. | 713/300 |
| 2002/0129186 | A1 | * | 9/2002 | Emerson et al. | 710/302 |

(Continued)

FOREIGN PATENT DOCUMENTS

JP       2001-167001       6/2001

(Continued)

OTHER PUBLICATIONS

Japanese Office Action issued Nov. 18, 2008 in connection with corresponding Japanese application No. 2005-086814.

(Continued)

*Primary Examiner*—Gabriel L Chu
(74) *Attorney, Agent, or Firm*—Ostrolenk Faber LLP

(57) ABSTRACT

A serial-transmission type memory system with a hot swapping function is provided which is capable of replacing a defective memory module without stopping the system. One end of a row of memory modules is connected to one input-output section of a memory controller and the memory controller exerts control so that, when a failure occurs in any of the memory modules, by disconnecting the defective memory module from the memory module in its preceding stage and by sequentially connecting the memory module in the row of the memory modules in a next and onward stage and a spare memory module connected to another end of the row of the memory modules to the other input-output section of the memory controller in series through second read and write signal lines to gain access to each of the memory modules.

9 Claims, 11 Drawing Sheets

U.S. PATENT DOCUMENTS

| | | |
|---|---|---|
| 2003/0079073 A1* | 4/2003 | Richard et al. .............. 710/302 |
| 2006/0020740 A1* | 1/2006 | Bartley et al. ............... 711/100 |
| 2006/0095592 A1* | 5/2006 | Borkenhagen ................. 710/2 |
| 2006/0198114 A1* | 9/2006 | Coutancier et al. .......... 361/788 |

FOREIGN PATENT DOCUMENTS

| | | |
|---|---|---|
| JP | 2004-185199 | 7/2004 |
| JP | 2006-526848 | 11/2006 |
| JP | 2006-528394 | 12/2006 |
| WO | 2004/102403 A2 | 11/2004 |
| WO | 2004/109528 A2 | 12/2004 |

OTHER PUBLICATIONS

Partial English translation of Office Action issued by Japanese Patent Office in connection with Japanese application No. 2005-086814 submitted in lieu of statement of relevancy.

* cited by examiner

MEMORY SYSTEM WITH HOT SWAPPING FUNCTION AND METHOD FOR REPLACING DEFECTIVE MEMORY MODULE

BACKGROUND OF THE INVENTION

1. Field of the Invention

The present invention relates to a memory system with a hot swapping function capable of replacing a defective memory module without the need for stopping the memory system when a memory error occurs in a system such as an information processing device or a like using a memory module as a storage device and to a method for replacing the defective memory module.

The present application claims priority of Japanese Patent Application No. 2005-086814 filed on Mar. 24, 2005, which is hereby incorporated by reference.

2. Description of the Related Art

In information processing devices such as a server or a like, a memory module (or plurality of memory modules) is used as a main storage in many cases. When an error or a failure occurs in a memory module, to replace the memory module, generally, the memory system is stopped for the replacement. In ordinary cases, the memory module cannot be replaced without stopping the memory system. Thus, access to a memory cannot be suspended to continue operations of the system.

To solve this problem, in addition to a method by which a device itself is duplicated, a memory mirroring method is known in which only a memory system is duplicated and memory data is stored in a redundant manner for every memory bus. FIG. 9 is a simplified diagram explaining the memory mirroring method in which a memory controller 1, memory buses 2 and 3, memory modules 4, 5, and 6 and memory modules 7, 8, and 9 are shown. As shown in FIG. 9, the memory controller 1, by making both the memory buses 2 and 3 perform the same operation, can write the same data to a group of the memory modules 4 and 7, of the memory modules 5 and 8, and of the memory modules 6 and 9. Therefore, when a memory module on either one side is to be replaced, by stopping the memory bus on a side where the memory module to be replaced is being connected, the memory module can be replaced. In this state, the system can continue operations using the memory module on one side through the memory bus on the side where its operations are not stopped and, therefore, after the completion of the replacement of the memory module, simply writes the same data stored in the memory module on the side where operations of the memory module were performed to the replaced memory module through the memory bus on the side where the replacement of the memory module was made.

As is apparent from the operating method as described above, in the case of the memory mirroring method, a memory capacity attributable to performance of the device becomes one-half the memory capacity that the device has. Thus, if the memory mirroring method is employed, it is necessary to double the memory capacity. However, under present circumstances, a price of a memory exerts a great influence on a price of an entire system and, therefore, it is expensive to employ the mirroring method easily.

Moreover, a memory system is disclosed in Patent Reference 1 (Japanese Patent Application Laid-open No. 2004-185199) which has a plurality of memory modules, buffer sections of which are connected in series through a bus and also has a hard disc device on which data stored in the memory modules is copied. According to the disclosed memory system, a hot swapping function is realized in a manner in which a memory module can be replaced by getting access to a corresponding address of the hard disc device when a request for access to a memory module to be replaced is made and in which, after completion of the replacement, data of the hard disc is copied into a corresponding address of the replaced memory module. However, in the invention described in the Patent Reference 1, instead of duplicating a memory module, a memory mirroring is performed by providing the hard disc device, which presents a problem in that more time is required for the hard disc to gain access to the memory modules when compared with the case of the memory mirroring method.

Also, a method is preferably thought to be applicable in which operations of the memory system can be continued by having only one piece of a memory module as a spare memory module and by performing switching between access to a defective memory module and access to the spare memory module when an error occurs. However, by this method, though it is made possible to stop the use of the memory module in which an error has occurred, it is impossible to physically replace the defective memory module to replace the defective memory module with a conforming memory. This is because a route of a memory bus is cut by the physical replacement of the defective memory module, which causes operations of an entire system to be stopped.

In this case, a method is thought to be applicable in which one piece of a spare memory module is provided and in which switching between a defective memory and a spare memory is performed by using a switch, however, in a memory bus circuit in which a plurality of memory modules is daisy-chained, if switching among memory modules is performed using a switch without stopping access to memory modules, connections among circuits for switching are made complicated and long and, as a result, an influence on a transmission waveform of a memory bus occurs, thus presenting a problem in terms of stable operations of the memory system.

FIG. 10 is a simplified diagram explaining a memory system having one piece of a spare memory module 15 in which a memory controller 10, a memory bus 11, and memory modules 12, 13, 14, and 15 are shown. In the memory system shown in FIG. 10, when only the memory modules 12, 13, and 14 are used and the memory module 15 is used as a spare in ordinary cases and, if an error occurs in, for example, the memory module 13 and the use of the memory module 13 is to be stopped, data stored in the memory module 13 is transferred to the memory module 15 and the controller 10 is made to recognize that the memory module 15 is a substitute for the memory module 13 and no access to the memory module 13 is made.

However, in this case, even if the memory controller 10 gets no access to the memory module 13, wirings between the memory bus 11 and memory module 13 still remain connected and, therefore, the removal of the memory module 13 exerts an influence on transmission waveforms through the memory bus 11, which makes it impossible to perform stable operations of the memory system. At this time point, even when the memory module 13 is disconnected by a switch or a like, the similar influence on the transmission waveforms is unavoidable.

Moreover, in a memory system of a serial-transmission type being proceeding toward practical use or commercial feasibility, there is a problem that, if power supply is stopped to a memory module by using a switch or a like, data cannot be transmitted to a memory module connected subsequent to the memory module to which the power supply has been stopped.

FIG. 11 is a simplified diagram showing an example of a memory system of a serial-transmission type in which a memory controller 16, a read signal line 17, a write signal line 18, memory modules 19, 20, and 21, and buffers 22, 23, and 24 are shown. The buffers 22, 23, and 24 are mounted on the memory modules 19, 20, and 21 respectively and are used for serial transmission of data.

In the memory system shown in FIG. 11, if operations of, for example, the memory module 20 are stopped or disconnected, the memory controller 16 cannot access the memory module 21. As is apparent from the example, even in the case of the memory system of the serial-transmission type, it is impossible to disconnect a memory module without stopping the memory system so long as the conventional method is used.

Thus, the conventional memory system has a problem that replacement of a defective memory module is possible by using the mirroring method, however, a rise in costs is unavoidable due to system duplication using memory modules or other storage devices or a like.

Moreover, in the conventional memory system having one piece of a spare memory module, though a rise in costs is small, there is a problem in that stable operations cannot be achieved due to fluctuations of transmission waveforms through a memory bus caused by switching of circuits or a like required when a defective memory module is pulled out for removal.

Furthermore, in the conventional memory system of a serial-transmission type, a memory module cannot be disconnected without stopping the memory system.

SUMMARY OF THE INVENTION

In view of the above, it is an object of the present invention to provide a serial-transmission type memory system with a hot swapping function which is capable of replacing a defective memory module, by simply having a minimum one piece of a spare memory module, without the need for stopping the memory system and a method for replacing the defective memory module.

According to a first aspect of the present invention, there is provided a memory system with a hot swapping function being a serial-transmission type memory system including a row of a plurality of memory modules sequentially connected to one another in series and a memory controller provided with a first input-output section and a second input-output section, wherein the memory controller, to the first input-output section of which one end of the row of the plurality of memory modules is connected, ordinarily performs operations of reading and writing data by accessing each of the memory modules through a first read signal line and a first write signal line and exerts control so that, when a failure occurs in any of the memory modules, by disconnecting a defective memory module from the memory module in its preceding stage and by sequentially connecting the memory modules contained in the row of the memory modules in next and onward stages subsequent to the defective memory module and a spare memory module connected to another end of the row of the memory modules to the second input-output section of the memory controller in series through a second read signal line and a second write signal line to gain access to each of the memory modules, the memory controller is able to withdraw the defective memory module and to insert a memory module for replacement.

In the foregoing, a preferable mode is one wherein the memory system is constructed so that the memory controller, when a failure occurs in any one of the memory modules contained in the row of the memory modules, disconnects the defective memory module from the memory modules in succeeding stages and connects the memory modules in the succeeding stages to the second input-output section through the spare memory module and, with the defective memory module disconnected from the memory module in the preceding stage, copies data stored in the defective memory module into the spare memory module and, after completion of the copying, replaces the defective memory module with the spare memory module to gain access to each of the memory modules from the second input-output section and, after the replacement of the defective memory module, copies data stored in the spare memory module into the memory module used to replace the defective memory module and, after completion of the copying, with the memory module used to replace the defective memory module connected to the memory modules in preceding and succeeding stages, gains access to each of the memory modules from the first input-output section thereafter.

Also, a preferable mode is one wherein each of the memory modules includes:

one read data input-output terminal and another read data input-output terminal;

one write data input-output terminal and another write data input-output terminal;

a plurality of memory devices each writing and reading data in parallel;

a serial-parallel converting unit to convert read data fed from each of the memory devices from parallel data to serial data and to convert write data to be output to each of the memory devices from serial data to parallel data; and a buffer unit to transfer read data fed from the serial-parallel converting unit to the one read data input-output terminal or the other read data input-output terminal and write data fed from the one write data input-output terminal to the serial-parallel converting unit or the other write data input-output terminal.

Also, a preferable mode is one wherein the buffer unit includes:

a first switching unit to perform switching between read data output from the serial-parallel converting unit and read data input from the one read data input-output terminal and to output the switched data to the other read data input-output terminal; and a second switching unit to switch write data input from the one write data input-output terminal to the write data to be output to the serial-parallel converting unit and to the write data to be output to the other write data input-output terminal.

Also, a preferable mode is one wherein each of the switching units includes:

first and second switching elements connected in series between the one read data or write data input-output terminal and the other read data or write data input-output terminal;

a third switching element connected between a midpoint between the first switching element and second switching element and the serial-parallel converting unit; and a switching control unit to control ON/OFF of each of the switching elements according to a control signal fed from the memory controller.

Furthermore, a preferable mode is one wherein one or a plurality of buffers is mounted on a second read signal line and second write signal line between the spare memory module and the memory controller.

According to a second aspect of the present invention, there is provided a method for replacing a defective memory module in a memory system, with a hot swapping function, being a memory system in which one end of a row of a plurality of memory modules sequentially connected to one another in series is connected to a first input-output section of a memory controller and another end of the row of memory modules is connected, with a spare memory module connected in series, to a second input-output section of the memory controller and the memory controller ordinarily gains access to each of the memory modules making up the memory module row to read or write data in series, the method including:

exerting control so that, when a failure occurs in any one of the memory modules making up the memory module row, the memory controller disconnects the defective memory module from the memory modules in a succeeding stage and connects the memory module in the succeeding stage to the second input-output section through the spare memory module;

exerting control so that, with the defective memory module disconnected from the memory modules in succeeding stages, data stored in the defective memory module is copied into the spare memory module and, after completion of the copying, the defective memory module is replaced with the spare memory module and the memory controller gains access to each of the memory controllers from the second input-output section; and exerting control so that, after the replacement of the defective memory module, data stored in the spare memory module is copied into the memory module used instead of the defective memory module and, after completion of the copying, with the memory module used instead of the defective memory module connected to memory modules in next and onward stages, the memory controller gains access to each of the memory modules from the first input-output section thereafter.

With the above configurations, the serial-transmission type memory system with the hot swapping function can replace a defective memory module, simply by having a minimum of one piece of the spare memory module, without the need for stopping the memory system.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

According to a memory system with a hot swapping function being a serial-transmission type memory system having a row of a plurality of memory modules sequentially connected to one another in series, one end of the row of the memory modules is connected to one input-output section of a memory controller and the memory controller ordinarily performs operations of reading and writing data by getting access to each of the memory modules through a first read signal line and a first write signal line and exerts control so that, when a failure occurs in any of the memory modules, a defective memory module is disconnected from a memory module in its preceding stage and by sequentially connecting the memory module contained in the row of the memory modules in the next and onward stages and a spare memory module connected to the end of the row of the memory modules is connected sequentially to the other input-output section of the memory controller in series through a second read signal line and a second write signal line to gain access to each of the memory modules and, therefore, the memory system can pull out the defective memory module and can insert a memory module for replacement.

First Embodiment

Figure 1:
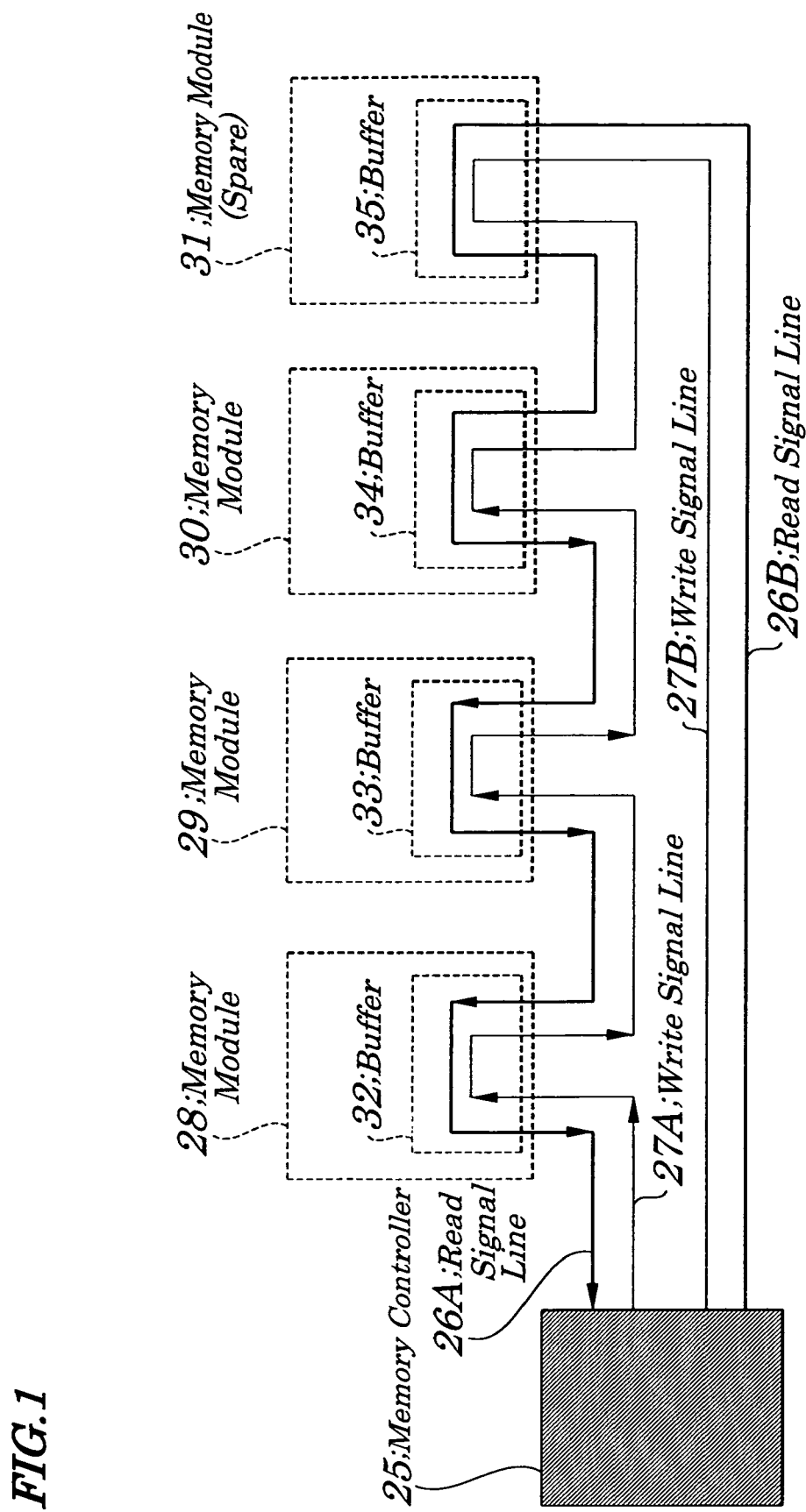
FIG. 1 is a block diagram showing configurations of a memory system with a hot swapping function according to a first embodiment of the present invention.
Figure 2:
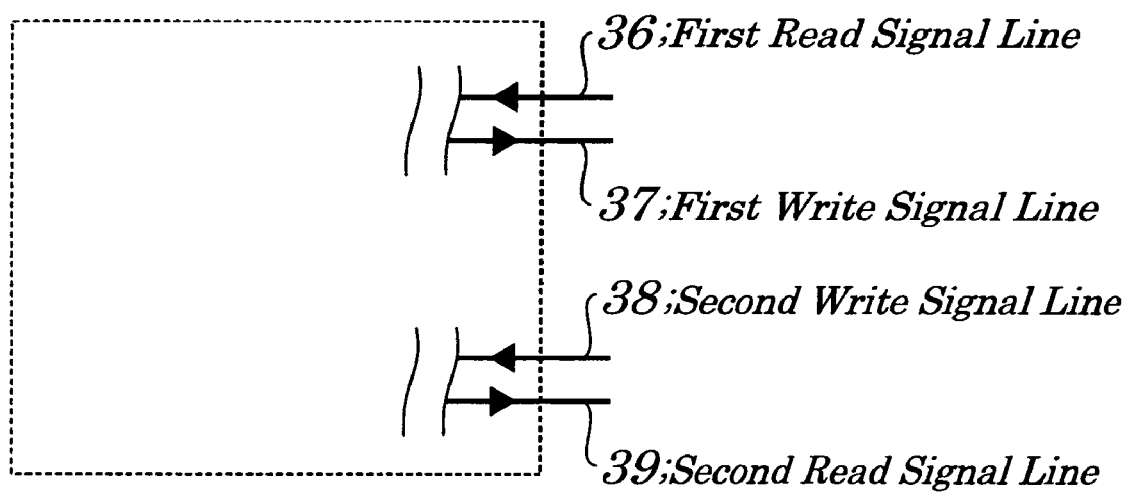
FIG. 2 is a schematic diagram showing configurations of a memory wiring input-output section of a memory controller according to the first embodiment of the present invention.
Figure 3:
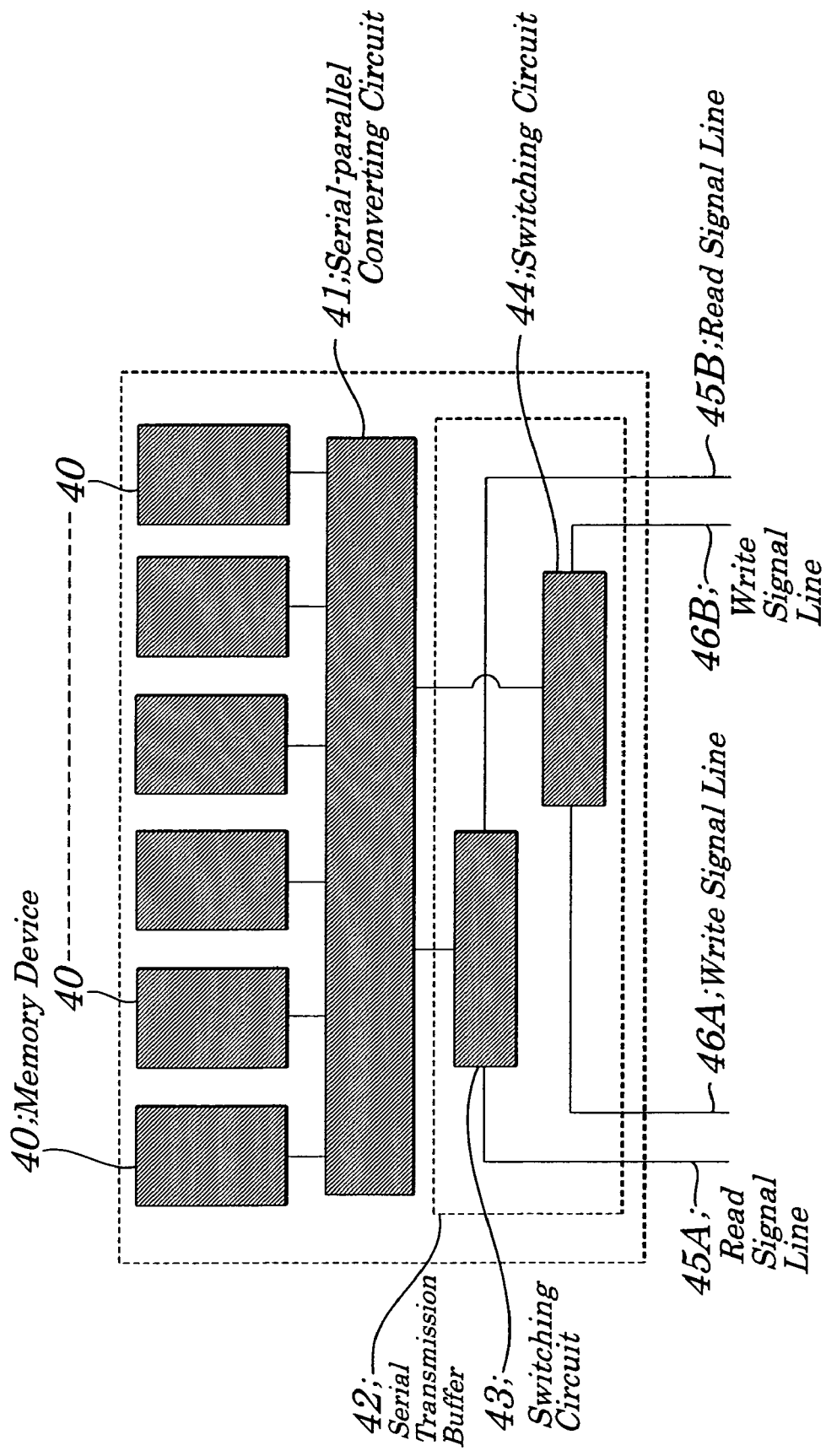
FIG. 3 is a simplified diagram showing internal configurations of each memory module according to the first embodiment of the present invention.
Figure 4:
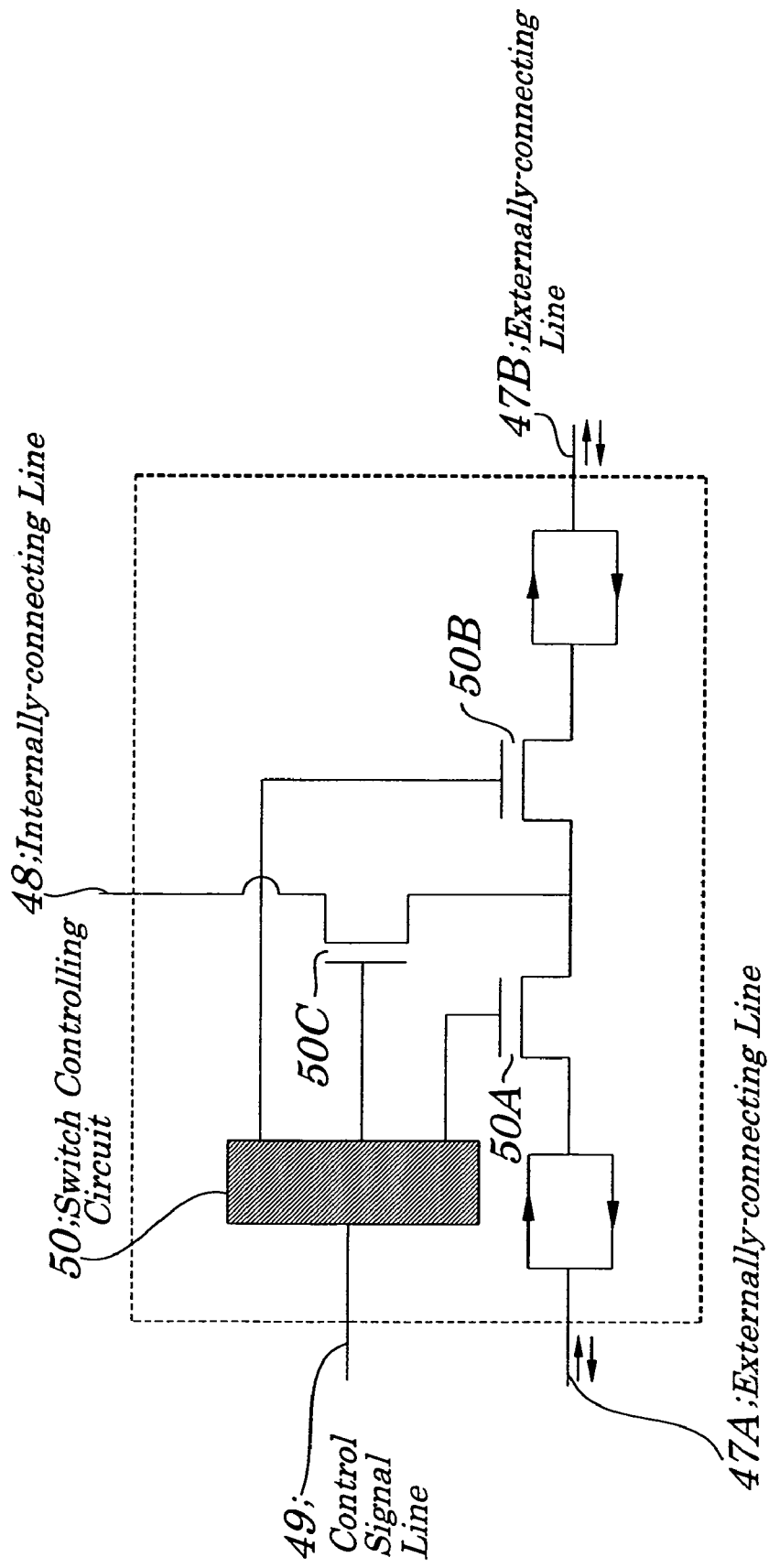
FIG. 4 is a diagram showing internal configurations of each switching circuit according to the first embodiment of the present invention.
Figure 5:
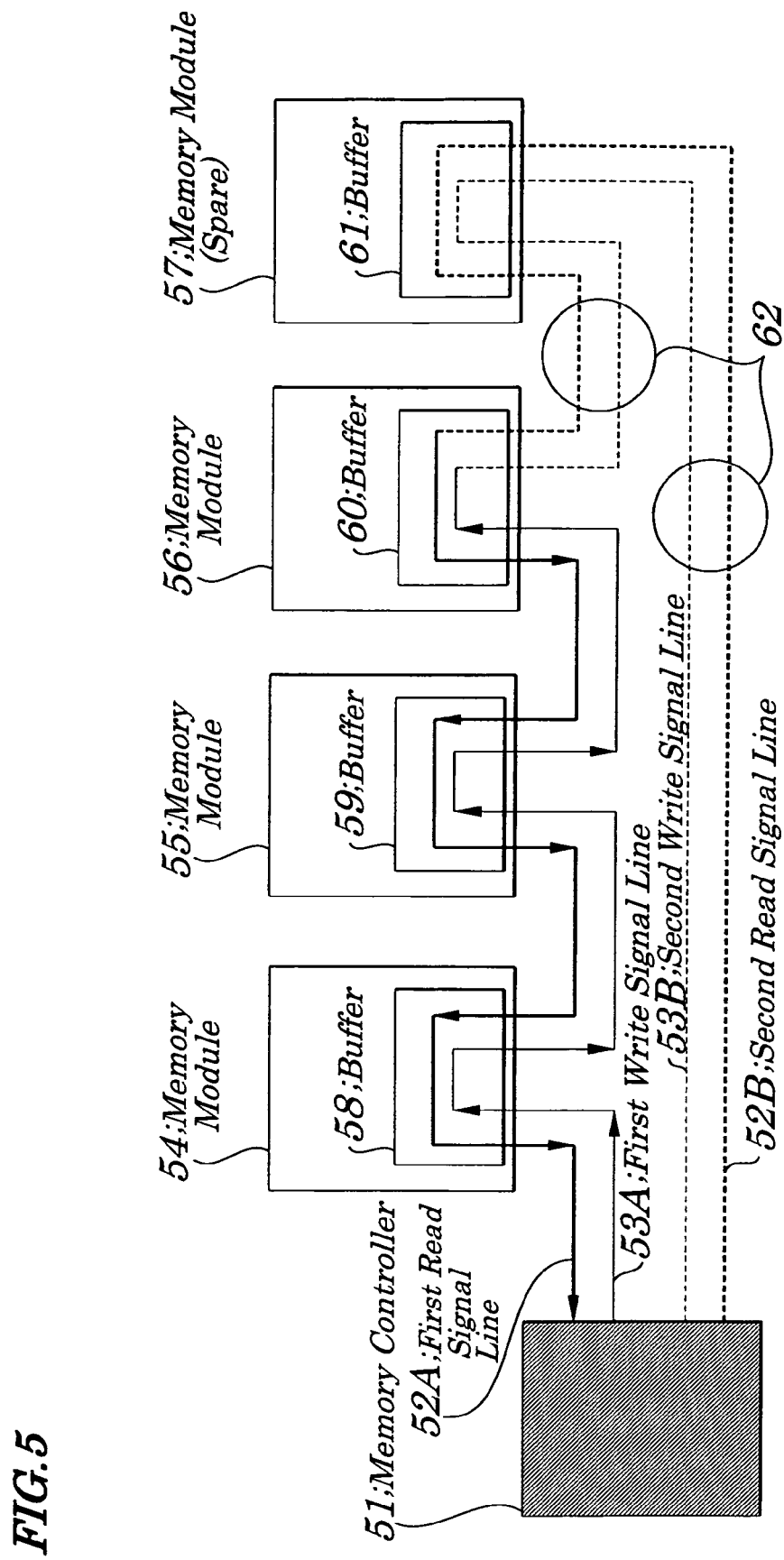
FIG. 5 is a diagram showing a normal operation state of the memory system according to the first embodiment of the present invention.
Figure 6:
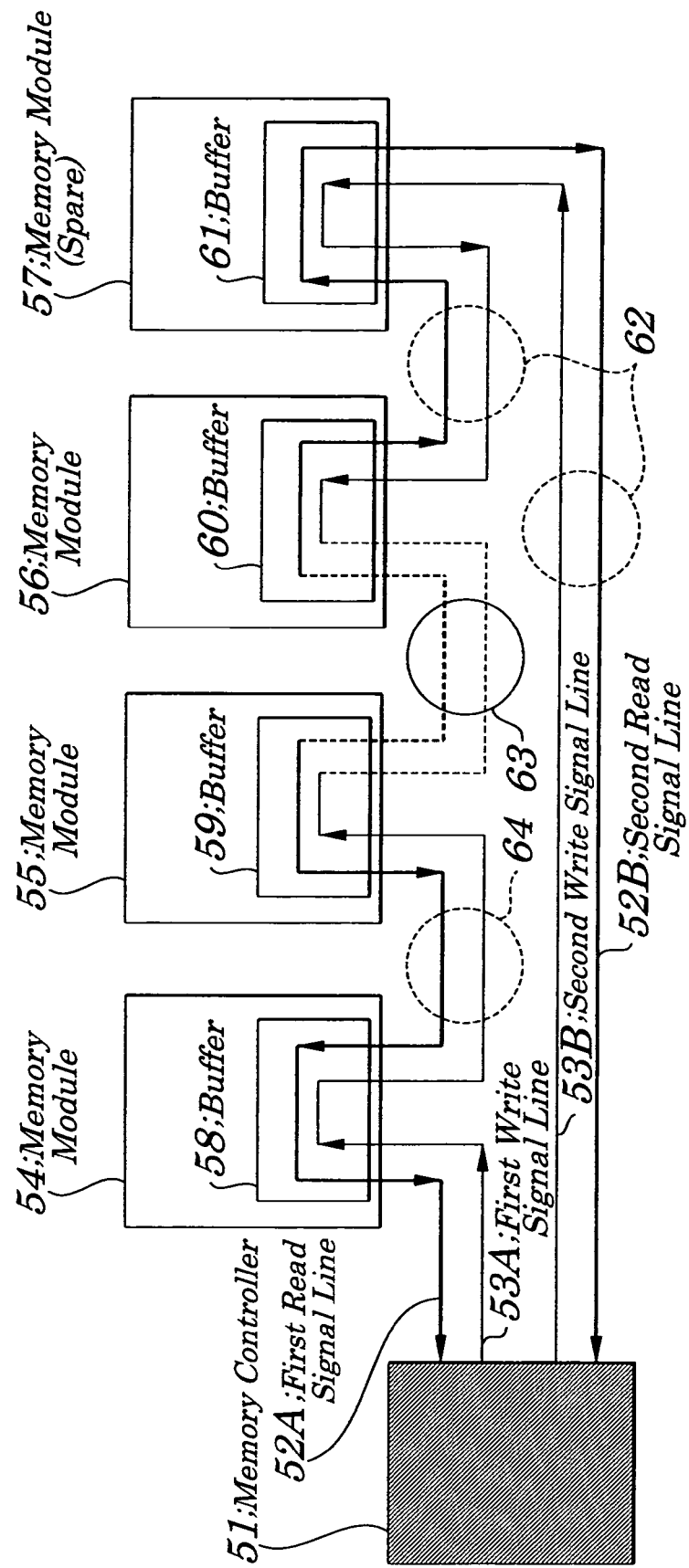
FIG. 6 is a diagram explaining a change of a signal transmission state at time of occurrence of a memory error according to the first embodiment of the present invention.
Figure 7:
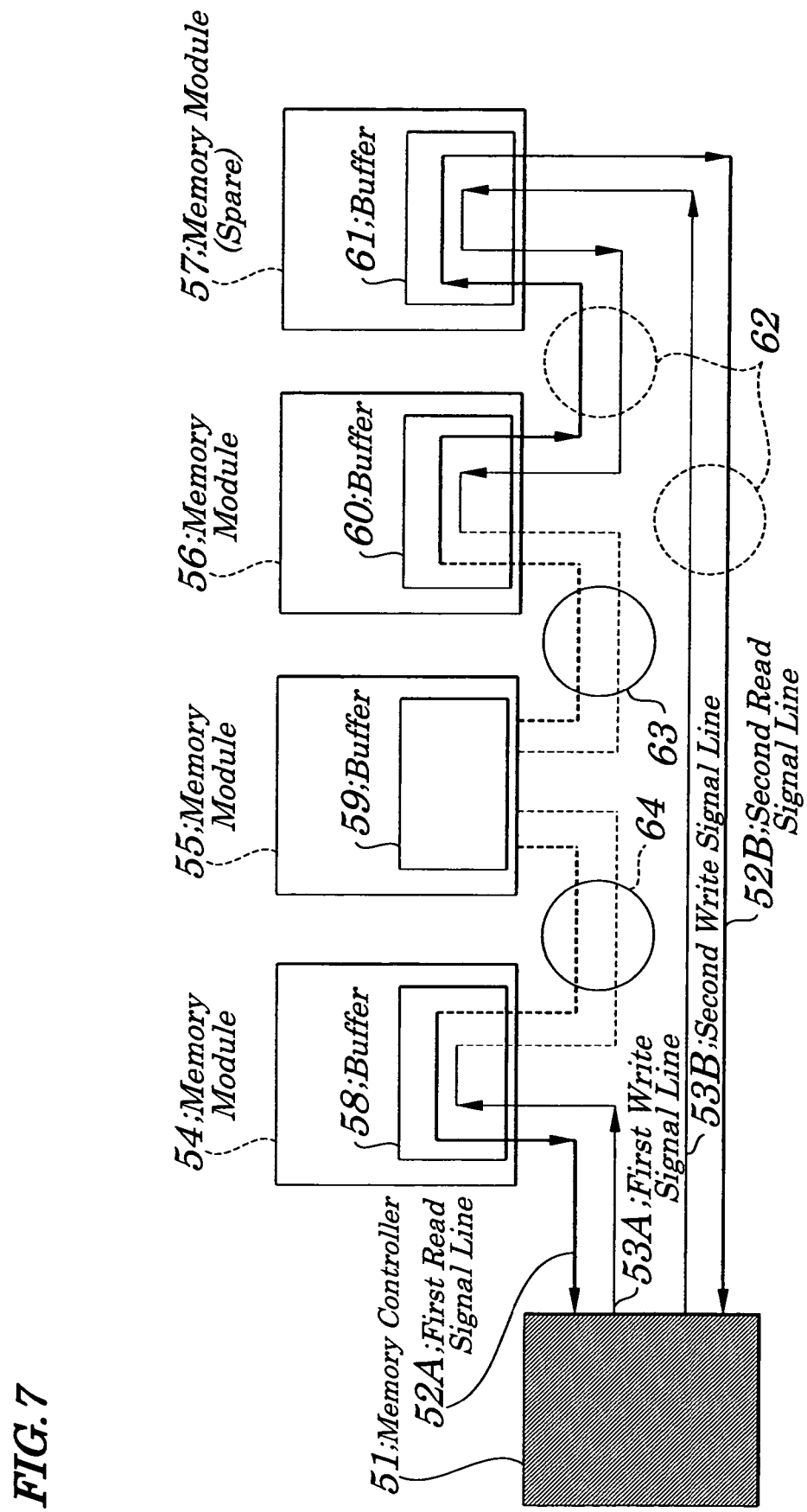
FIG. 7 is a diagram explaining processing to be performed after replacement of a defective memory module according to the first embodiment of the present invention.

FIG. 1 is a block diagram showing configurations of a memory system with a hot swapping function of the first embodiment of the present invention. FIG. 2 is a schematic diagram for showing configurations of a memory wiring input-output section of a memory controller 25 according to the first embodiment of the present invention. FIG. 3 is a simplified diagram showing internal configurations of each memory module of the first embodiment of the present invention. FIG. 4 is a diagram showing internal configurations of each switching circuit of the first embodiment of the present invention. FIG. 5 is a diagram showing a normal operation state of the memory system of the first embodiment of the present invention. FIG. 6 is a diagram explaining a change of a signal transmission state at time of occurrence of a memory error of the first embodiment of the present invention. FIG. 7 is a diagram explaining processing to be performed after replacement of a defective memory module according to the first embodiment of the present invention.

The memory system with a hot swapping function of the first embodiment, as shown in FIG. 1, mainly includes the memory controller 25, a first read signal line 26A, a first write signal line 27A, a second read signal line 26B, a second write signal line 27B, memory modules 28, 29, 30, and 31, serial transmission buffers 32, 33, 34, and 35 mounted on the memory modules 28, 29, 30, and 31, respectively. Out of these, the memory module 31 and the buffer 35 mounted on the memory module 31 are spares.

As shown in FIG. 1, in the hot swapping function of the first embodiment, as in the case of the conventional memory system of a serial-transmission type, the buffers 32, 33, and 34 mounted respectively on the memory modules 28, 29, and 30 are sequentially connected by the first read signal line 26A and first write signal line 27A to one input-output section of the memory controller 25. The spare buffer 35 mounted on the spare memory module 31 is directly connected by the second read signal line 26B and the second write signal line 27B to the other input-output section of the memory controller 25. Moreover, though not shown in FIG. 1, power is independently applied to each of the memory modules 28, 29, 30, and 31 and each of the memory modules 28, 29, 30, and 31 is independently shut off according to an instruction of the memory controller 25 so that operations of each of the memory modules 28, 29, 30, and 31 can be stopped separately.

FIG. 2 is the schematic diagram for showing an input-output section of memory wirings in the memory controller 25. As shown in FIG. 2, to one input-output section of the memory controller 25 are connected a first read signal line 36 and a second write signal line 37 and to the other input-output section are connected a second read signal line 39 and a second write signal 38. Thus, in the memory system with the hot swapping function of the first embodiment, the number of its memory input-output lines is twice as large as that of memory input-output lines in the conventional memory system of the serial-transmission type shown in FIG. 11.

Each of the memory modules 28, 29, 30, and 31, as shown in FIG. 3 in a simplified form, has its internal configuration mainly made up of a plurality of memory devices 40, a serial-parallel converting circuit 41, a serial transmission buffer 42. The buffer 42 includes a switching circuit 43 to be used for a read signal line and a switching circuit 44 to be used for a write signal line. Moreover, in FIG. 3, only signals being used as data signals are shown and signals used for control are not shown. Each of the memory devices 40 writes and reads data in parallel. The serial-parallel converting circuit 41 converts read data made up of parallel data output from each of the memory devices 40 into serial data to output the converted data to the buffer 42 and write data made up of serial data output from the buffer 42 into parallel data to output the converted data to each of the memory devices 40.

By switching performed by the serial transmission buffer 42 according to control of the memory controller 25, to a read signal line 45A of one input-output end is selectively output either of read data fed from a read signal line 45B of the other input-output end or read data fed from the serial-parallel converting circuit 41. Similarly, also by switching performed by the serial transmission buffer 42 according to control of the memory controller 25, to the read signal line 45B of the other input-output end is selectively output either of read data fed from the read signal line 45A of one input-output end or read data fed from the serial-parallel converting circuit 41. Also, by switching performed by the serial transmission buffer 42 according to control of the memory controller 25, write data input through a write signal line 46A of one input-output end is output through a write signal line 46B of the other input-output end or is output to the serial-parallel converting circuit 41 selectively. Similarly, by switching performed by the serial transmission buffer 42 according to control of the memory controller 25, write data input through the write signal line 46B of the other input-output end is output through the write signal line 46A of one input-output end or is output to the serial-parallel converting circuit 41, selectively.

Figure 11:
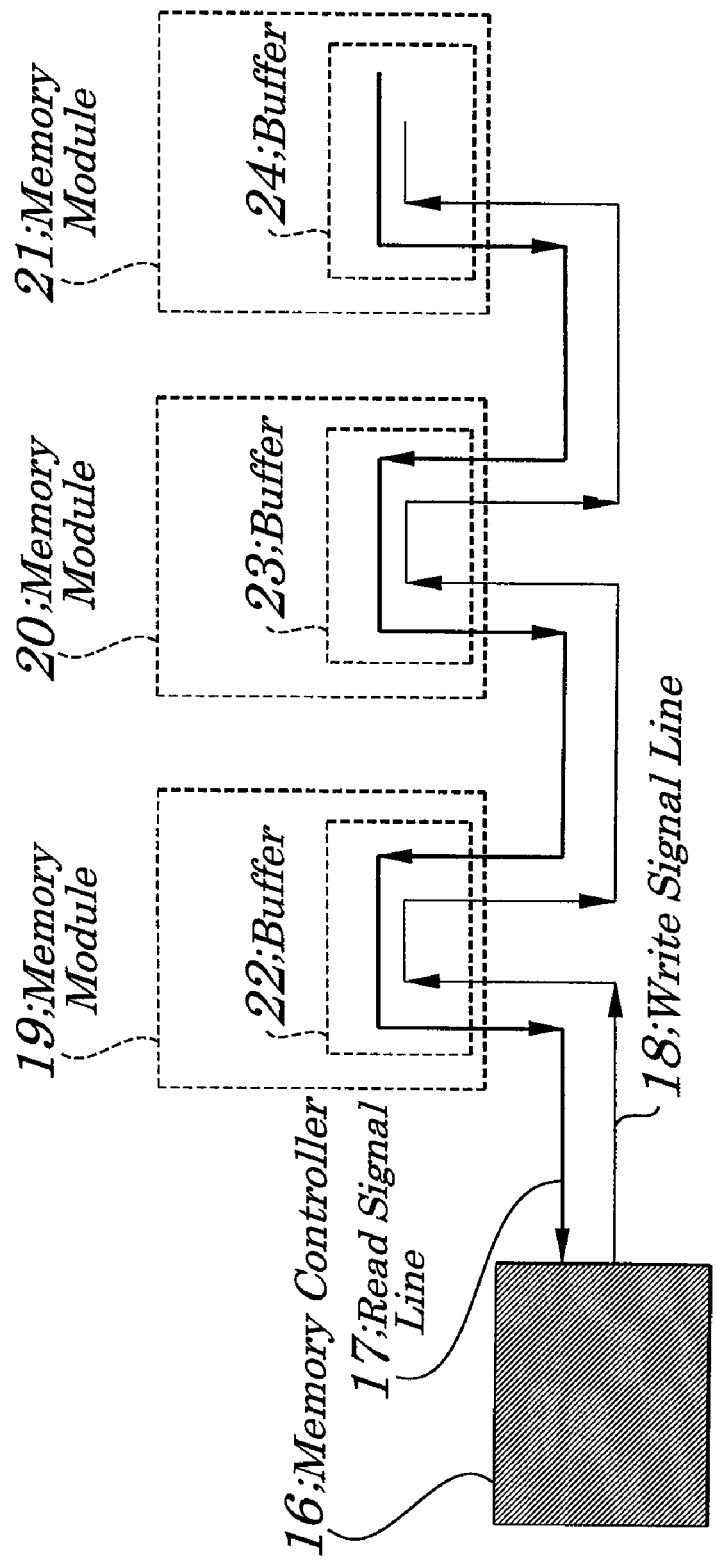
FIG. 11 is a simplified diagram showing an example of another conventional memory system of a serial-transmission type.

In the conventional memory system of a serial-transmission type as shown in FIG. 11, a wiring for a read signal is separated from that for a write signal and each of the read and write signal is simply transmitted unidirectionally. However, in the memory system shown in FIG. 1, though the wiring for a read signal is separated from that for a write signal, signals are transmitted not only unidirectionally but also bidirectionally and, therefore, as shown in FIG. 3, bidirectional transmission of signals is required even in circuits within each of the memory modules 28, 29, 30, and 31 (FIG. 1).

FIG. 4 is a diagram showing an example of internal configurations of each of the switching circuits 43 and 44 making up the serial transmission buffer 42 (32, 33, 34, and 35). Each of the switching circuits 43 and 44 mainly includes externally-connecting lines 47A and 47B to connect a corresponding memory module 28, 29, 30, or 31, which incorporates the switching circuit 43 or 44 itself therein, to external components (that is, memory controller 25, or other memory module 28, 29, 30, or 31), internally-connecting line 48 to connect the switching circuit 43 or 44 itself to the serial-parallel converting circuit 41 (FIG. 3), a control signal line 49 to which a control signal is input from the memory controller 25, transistors 50A, 50B, and 50C, and a switch controlling circuit 50 to exert ON-OFF control over each transistors 50A, 50B, and 50C each serving as a switching element. In each of the switching circuits 43 and 44, a control signal output from the memory controller 25 shown in FIG. 1 is input through the control signal line 49 to the switch controlling circuit 50 which then, by using the control signal, exerts ON/OFF control over each of the transistors 50A, 50B, and 50C to perform switching of a direction of signal transmission described by referring to FIG. 3.

More specifically, switching is performed so that data input from the externally-connecting line 47A, when the transistors 50A and 50B are ON and the transistor 50C is OFF, is transmitted to the externally-connecting line 47B and, when the transistors 50A and 50C are ON and the transistor 50B is OFF, is transmitted to the internally-connecting line 48 and so that data input from the externally-connecting line 47B, when the transistors 50B and 50A are ON and the transistor 50C is OFF, is transmitted to the externally-connecting line 47A and, when the transistors 50B and 50C are ON and the transistor 50A is OFF, is transmitted to the internally-connecting line 48. Also, switching is performed so that data input from the internally-connecting line 48, when the transistors 50C and 50A are ON and the transistor 50B is OFF, is transmitted to the externally-connecting line 47A and, when the transistors 50C and 50B are ON and the transistor 50A is OFF, is transmitted to the externally-connecting line 47B.

Operations of the memory system with the hot swapping function of the first embodiment are described by referring to FIG. 5 to FIG. 7. As shown in FIG. 5 to FIG. 7, the memory system with the hot swapping function mainly includes a memory controller 51, a first read signal line 52A, a first write signal line 53A, a second read signal line 52B, a second write signal line 53B, and memory modules 54, 55, 56, and 57. The memory module 57 out of the memory modules 54, 55, 56, and 57 is a spare. Also, the memory modules 54, 55, 56, and 57 have buffers 58, 59, 60, and 61 for serial transmission respectively. Here, the first read signal line 52A and first write signal line 53A are signal lines used to connect one input-output section of the memory controller 51 to each of the buffers 58, 59, 60 mounted respectively in the memory modules 54, 55, and 56, whereas the second read signal line 52B and second write signal 53B are signal lines used to connect the other input-output section of the memory controller 51 and the buffer 60 provided in the memory module 56 through the buffer 61 provided in the memory module 57. Hereinafter, all read signal lines are shown by bold dashed lines and write signal lines are shown by thin dashed lines.

FIG. 5 shows an ordinary operation state in the memory system with the hot swapping function. In this state, access to the spare memory module 57 is not required and, therefore, as shown by a reference number 62 in FIG. 5, a read signal and a write signal are not transmitted between the memory module 56 and the spare memory module 57 and between the spare memory module 57 and the memory controller 51. In this state, by stopping power supply to the spare memory module 57, inserting and pulling-out of the spare memory module 57 are made possible without the need for stopping the memory system.

The memory controller 51, if having judged that, due to several occurrences of single-bit errors in, for example, the memory module 55, replacement of the memory module 55 is necessary, starts transmission, shown by a reference number 62 in FIG. 6, of a read signal and a write signal between the memory modules 56 and 57 and between the memory module 57 and the memory controller 51 and, at the same time, stops transmission, shown by a reference number 63 in FIG. 6, of a read signal and a write signal between the memory modules 55 and 56. At this time point, the memory controller 51 changes its recognition of connected positions of memory modules 55, 56, and 57 so that the memory controller 51 recognizes that the memory module 56 is not connected subsequently to the memory module 55 but subsequently to the memory module 57 in retrograde order. In this state, directions of a read signal and a write signal to be input to the memory module 57 and to output from the memory module 57 are opposite to those in the ordinary operation state shown in FIG. 5.

In the state shown in FIG. 6, data stored in the memory module 55 is copied into the memory module 57. When copying is completed, the memory controller 51 recognizes the memory module 57 as a substitute for the memory module 55 and stops transmission to the memory module 55, as shown by a reference number 64 in FIG. 6, of a signal to the memory module 55.

FIG. 7 shows a state in which replacement of the defective memory module 55 with the memory module 57 has been finished and transmissions, shown by a reference number 62 in FIG. 7, of read and write signals are made between the memory modules 56 and 57 and between the memory module 57 and the memory controller 51 and transmissions, shown by a reference number 63 in FIG. 7, are stopped between the memory modules 55 and 56 and transmissions, shown by a reference number 64 in FIG. 7, of read and write signals between the memory modules 54 and 55 are stopped and, therefore, by interrupting power supply to the memory module 55, inserting and withdrawing of the memory module 55 is made possible without the need for stopping the memory system, which allows the memory module 55 to be replaced accordingly.

After the replacement of the defective memory module 55 into a new memory module 55, to restore the present state to its original ordinary state as shown in FIG. 5, control is exerted in order opposite to that employed at time of withdrawal of the memory module 55 by providing instructions to the memory controller 51. That is, in the state shown in FIG. 7, power supply to the newly replaced memory module 55 is restarted and, as shown in FIG. 6, transmissions, shown by a reference number 64 in FIG. 7, of read and write signals are restarted and data stored in the memory module 57 is copied into the memory module 55 having undergone the physical replacement. After the completion of copying, as shown in FIG. 5, by starting the transmission, shown by the reference number 63 in FIG. 5, of read and write signals between the memory module 55 and 56 and by stopping the transmission, shown by the reference number 62 in FIG. 5, of read and write signals between the memory modules 56 and 57 and between the memory module 57 and the memory controller 51, the present state is returned back to its original state and the memory module 57 again starts to function as a spare memory module.

Thus, according to the serial-transmission type memory system with the hot swapping function, it is made possible to replace a defective memory module without the need for stopping the memory system.

Second Embodiment

Figure 8:
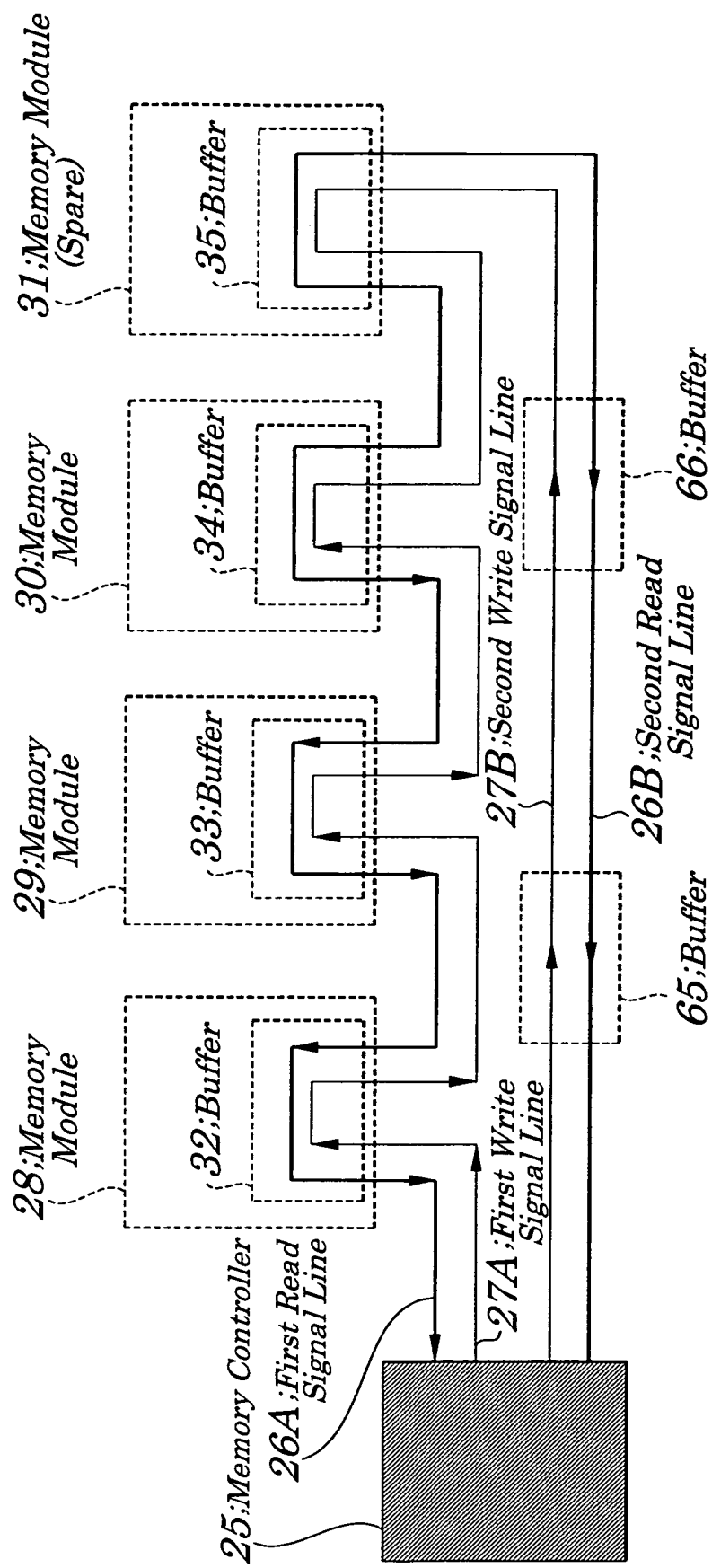
FIG. 8 is a block diagram showing configurations of a memory system with a hot swapping function according to a second embodiment of the present invention.
Figure 9:
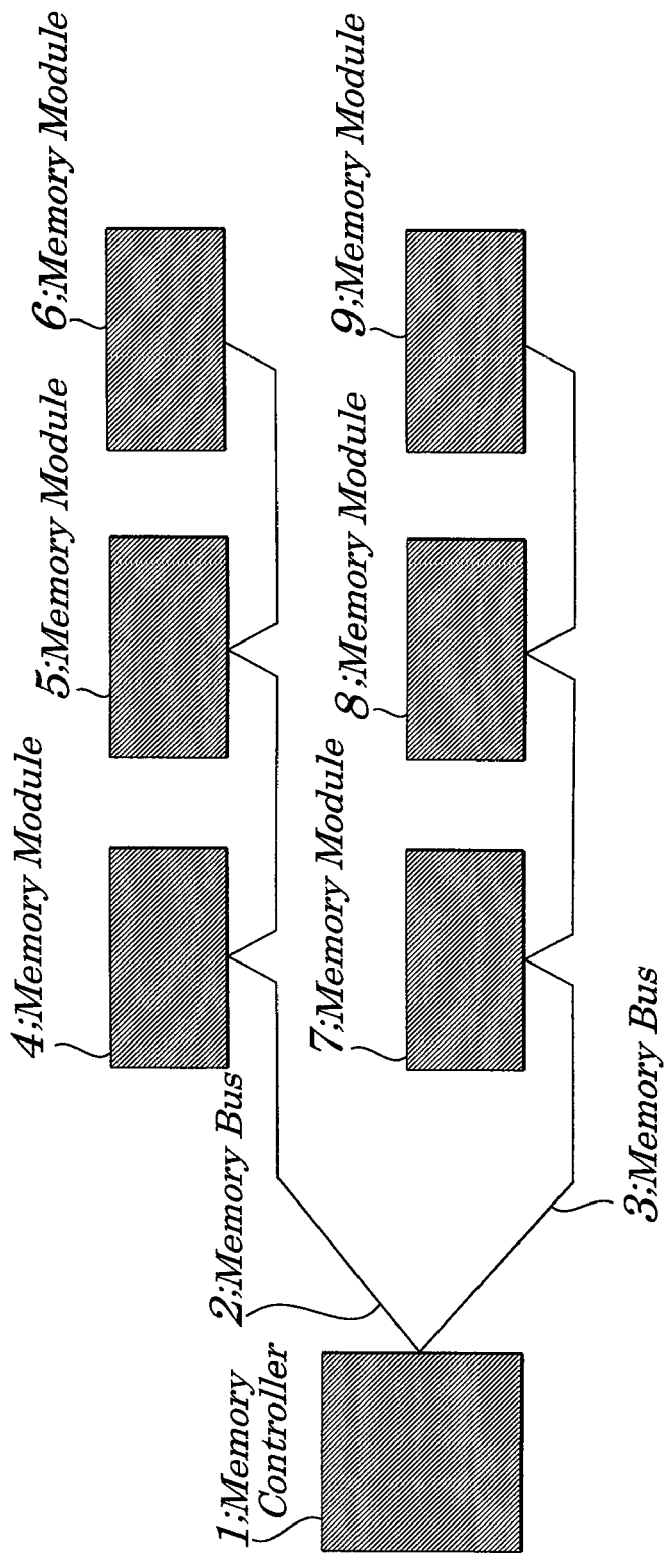
FIG. 9 is a simplified diagram explaining a conventional memory mirroring method.
Figure 10:
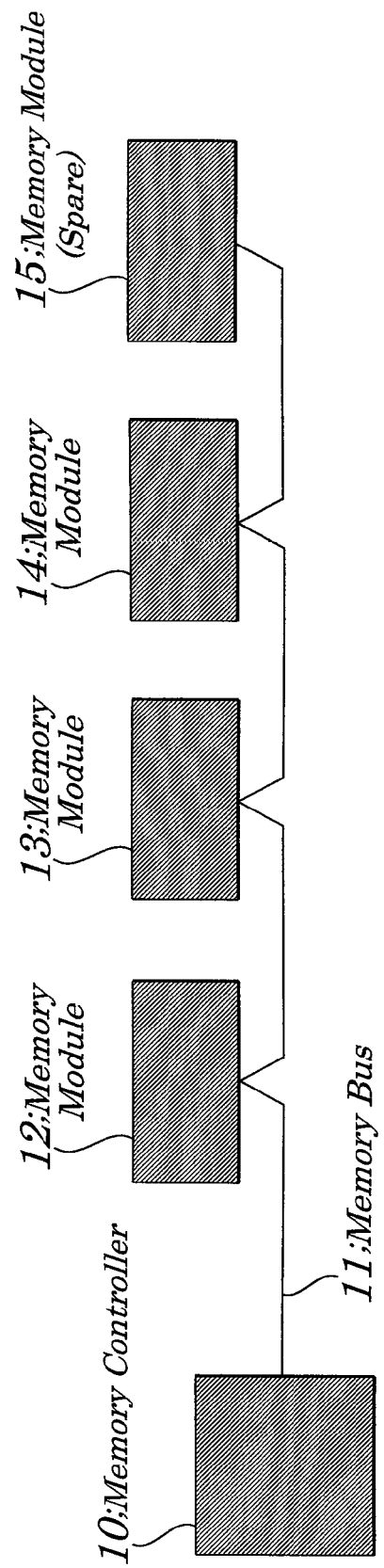
FIG. 10 is a simplified diagram explaining a conventional memory system having one piece of a spare memory module.

FIG. 8 is a block diagram showing configurations of a memory system with a hot swapping function of the second embodiment of the present invention. The memory system with the hot swapping function of the second embodiment, as shown in FIG. 8, mainly includes a memory controller 25, a first read signal line 26A, a first write signal line 27A, a second read signal line 26B, a second write signal line 27B, memory modules 28, 29, 30, and 31, buffers 32, 33, 34, and 35 for serial transmission mounted respectively on the memory modules 28, 29, 30, and 31, buffers 65 and 66 for signal amplification mounted respectively on the second read signal line 26B and second write signal line 27B. Out of them, the memory module 31 and the buffer 35 mounted on the memory module 31 are spares.

The memory system with the hot swapping function of the second embodiment shown in FIG. 8 differs from the memory system of the first embodiment in FIG. 1 only in that the buffers 65 and 66 are mounted on the second read signal line 26B and second write signal line 27B. Each of the buffers 65 and 66 amplifies a read signal being transmitted through the second read signal line 26B and a write signal being transmitted through the second write signal line 27B.

In the system with the hot swapping function of the second embodiment, if the memory system does not operate normally due to large attenuation of a read signal and a write signal through the second read signal 26B and the second write signal 27B caused by a long distance between the memory module 31 mounted at an end of a row of the memory modules and the memory controller 25, as shown in FIG. 8, by inserting the buffers 65 and 66, the attenuation is compensated for and normal operations are restored. In the embodiment, the number of buffers to be used in such cases as above is two, however, the present invention is not limited to this and the number may be one or an arbitrary plural number.

Thus, in the system with the hot swapping function of the second embodiment, even when a distance between the spare memory module 31 and memory controller 25 is long, by inserting buffers at such the place as described, attenuation of signals occurring midway between the spare memory module 31 and the memory controller 25 is compensated for and normal operations are restored.

It is apparent that the present invention is not limited to the above embodiments but may be changed and modified without departing from the scope and spirit of the invention. For example, drawings used to explain each of the embodiments are simplified and, therefore, only one read signal line and only one write signal line are shown, however, the number of signal lines may be an arbitrary plural number. Any number of control signal lines, though not shown, may be mounted. Moreover, in each of the embodiments, the memory system is explained as one memory channel system, however, the number of memory channels may be an arbitrary plural number. Also, cases are shown in which the number of memory modules is three, which are continuously used, and the number of spare memory modules is one, however, any number of memory modules may be used so long as the number of memory modules to be continuously used and to be used as a spare is one or more. The switching circuit shown in FIG. 4 may have any configuration so long as switching can be performed so that signals are transmitted bidirectionally through each of the externally-connecting lines mounted on both sides of the switching circuit. The switching element is not limited to transistors and any other semiconductor device may be employed.

The disclosed memory system with the hot swapping function of the present invention can be applied to all systems using memory modules and can be used most suitably, in particular, in a system such as a server in which system-down has to be reduced to a minimum.

What is claimed is:

1. A memory system with a hot swapping function being a serial-transmission type memory system comprising a row of a plurality of memory modules sequentially connected to one another in series and a memory controller provided with a first input-output section and a second input-output section, wherein said memory controller, to said first input-output section of which one end of the row of the plurality of memory modules is connected, ordinarily performs operations of reading and writing data by accessing each of the memory modules through a first read signal line and a first write signal line and exerts control so that, when a failure occurs in any of the memory modules, by disconnecting a defective memory module from the memory module in its preceding stage and by sequentially connecting the memory modules contained in the row of the memory modules in next and onward stages subsequent to the defective memory module and a spare memory module connected to another end of the row of the memory modules to said second input-output section of said memory controller in series through a second read signal line and a second write signal line to gain access to each of the memory modules, said memory controller is able to withdraw said defective memory module and to insert a memory module for replacement, wherein said memory system is constructed so that said memory controller, when a failure occurs in any one of the memory modules contained in the row of the memory modules, disconnects the defective memory module from the memory modules in succeeding stages and connects the memory modules in the succeeding stages to said second input-output section through the spare memory module and, with the defective memory module disconnected from the memory module in the preceding stage, copies data stored in the defective memory module into the spare memory module and, after completion of the copying, replaces the defective memory module with the spare memory module to gain access to each of the memory modules from said second input-output section and, after the replacement of the defective memory module, copies data stored in the spare memory module into the memory module used to replace the defective memory module and, after completion of the copying, with the memory module used to replace the defective memory module connected to the memory modules in preceding and succeeding stages, gains access to each of said memory modules from said first input-output section thereafter.

2. A memory system with a hot swapping function being a serial-transmission type memory system comprising a row of a plurality of memory modules sequentially connected to one another in series and a memory controller provided with a first input-output section and a second input-output section, wherein said memory controller, to said first input-output section of which one end of the row of the plurality of memory modules is connected, ordinarily performs operations of reading and writing data by accessing each of the memory modules through a first read signal line and a first write signal line and exerts control so that, when a failure occurs in any of the memory modules, by disconnecting a defective memory module from the memory module in its preceding stage and by sequentially connecting the memory modules contained in the row of the memory modules in next and onward stages subsequent to the defective memory module and a spare memory module connected to another end of the row of the memory modules to said second input-output section of said memory controller in series through a second read signal line and a second write signal line to gain access to each of the memory modules, said memory controller is able to withdraw said defective memory module and to insert a memory module for replacement, wherein each of the memory modules comprises:

one read data input-output terminal and another read data input-output terminal; one write data input-output terminal and another write data input-output terminal; a plurality of memory devices each writing and reading data in parallel;

a serial-parallel converting unit to convert read data fed from each of the memory devices from parallel data to serial data and to convert write data to be output to each of the memory devices from serial data to parallel data; and a buffer unit to transfer read data fed from the serial-parallel converting unit to the one read data input-output terminal or the other read data input-output terminal and write data fed from the one write data input-output terminal to the serial-parallel converting unit or the other write data input-output terminal.

3. The memory system with the hot swapping function according to claim 2, wherein said buffer unit comprises:

a first switching unit to perform switching between read data output from said serial-parallel converting unit and read data input from the one read data input-output terminal and to output the switched data to the other read data input-output terminal; and a second switching unit to switch write data input from the one write data input-output terminal to the write data to be output to the serial-parallel converting unit and to the write data to be output to the other write data input-output terminal.

4. The memory system with the hot swapping function according to claim 3, wherein the first or second switching unit comprises:

first and second switching elements connected in series between the one read data or write data input-output terminal and the other read data or write data input-output terminal;

a third switching element connected between a midpoint between the first switching element and second switching element and the serial-parallel converting unit; and a switching control unit to control ON/OFF of each of the switching elements according to a control signal fed from said memory controller.

5. A method for replacing a defective memory module in a memory system, with a hot swapping function, being a memory system in which one end of a row of a plurality of memory modules sequentially connected to one another in series is connected to a first input-output section of a memory controller and another end of said row of memory modules is connected, with a spare memory module connected in series, to a second input-output section of said memory controller and said memory controller ordinarily gains access to each of said memory modules making up the memory module row to read or write data in series, said method comprising:

exerting control so that, when a failure occurs in any one of said memory modules making up said memory module row, said memory controller disconnects the defective memory module from the memory modules in a succeeding stage and connects the memory module in the succeeding stage to said second input-output section through said spare memory module;

exerting control so that, with said defective memory module disconnected from the memory modules in succeeding stages, data stored in said defective memory module is copied into said spare memory module and, after completion of the copying, said defective memory module is replaced with said spare memory module and said memory controller gains access to each of said memory controllers from said second input-output section; and exerting control so that, after the replacement of said defective memory module, data stored in said spare memory module is copied into the memory module used instead of said defective memory module and, after completion of the copying, with said memory module used instead of said defective memory module connected to memory modules in next and onward stages, said memory controller gains access to each of said memory modules from said first input-output section thereafter.

6. A memory system with a hot swapping function being a serial-transmission type memory system comprising a row of a plurality of memory modules sequentially connected to one another in series and a memory controlling means provided with a first input-output section and a second input-output section, wherein said memory controlling means, to said first input-output section of which one end of the row of the plurality of memory modules is connected, ordinarily performs operations of reading and writing data by accessing each of the memory modules through a first read signal line and a first write signal line and exerts control so that, when a failure occurs in any of the memory modules, by disconnecting a defective memory module from the memory module in its preceding stage and by sequentially connecting the memory modules contained in the row of the memory modules in next and onward stages subsequent to the defective memory module and a spare memory module connected to another end of the row of the memory modules to said second input-output section of said memory controlling means in series through a second read signal line and a second write signal line to gain access to each of the memory modules, said memory controlling means is able to withdraw said defective memory module and to insert a memory module for replacement, wherein said memory system is constructed so that said memory controlling means, when a failure occurs in any one of the memory modules contained in the row of the memory modules, disconnects the defective memory module from the memory modules in succeeding stages and connects the memory modules in the succeeding stages to said second input-output section through the spare memory module and, with the defective memory module disconnected from the memory module in the preceding stage, copies data stored in the defective memory module into the spare memory module and, after completion of the copying, replaces the defective memory module with the spare memory module to gain access to each of the memory modules from said second input-output section and, after the replacement of the defective memory module, copies data stored in the spare memory module into the memory module used to replace the defective memory module and, after completion of the copying, with the memory module used to replace the defective memory module connected to the memory modules in preceding and succeeding stages, gains access to each of said memory modules from said first input-output section thereafter.

7. A memory system with a hot swapping function being a serial-transmission type memory system comprising a row of a plurality of memory modules sequentially connected to one another in series and a memory controlling means provided with a first input-output section and a second input-output section, wherein said memory controlling means, to said first input-output section of which one end of the row of the plurality of memory modules is connected, ordinarily performs operations of reading and writing data by accessing each of the memory modules through a first read signal line and a first write signal line and exerts control so that, when a failure occurs in any of the memory modules, by disconnecting a defective memory module from the memory module in its preceding stage and by sequentially connecting the memory modules contained in the row of the memory modules in next and onward stages subsequent to the defective memory module and a spare memory module connected to another end of the row of the memory modules to said second input-output section of said memory controlling means in series through a second read signal line and a second write signal line to gain access to each of the memory modules, said memory controlling means is able to withdraw said defective memory module and to insert a memory module for replacement, wherein each of the memory modules comprises:

one read data input-output terminal and another read data input-output terminal; one write data input-output terminal and another write data input-output terminal; a plurality of memory devices each writing and reading data in parallel;

a serial-parallel converting means to convert read data fed from each of the memory devices from parallel data to serial data and to convert write data to be output to each of the memory devices from serial data to parallel data; and a buffer means to transfer read data fed from the serial-parallel converting means to the one read data input-output terminal or the other read data input-output terminal and write data fed from the one write data input-output terminal to the serial-parallel converting means or the other write data input-output terminal.

8. The memory system with the hot swapping function according to claim 7, wherein said buffer means comprises:

a first switching means to perform switching between read data output from said serial-parallel converting means and read data input from the one read data input-output terminal and to output the switched data to the other read data input-output terminal; and a second switching means to switch write data input from the one write data input-output terminal to the write data to be output to the serial-parallel converting means and to the write data to be output to the other write data input-output terminal.

9. The memory system with the hot swapping function according to claim 8, wherein the first or second switching means comprises:

first and second switching elements connected in series between the one read data or write data input-output terminal and the other read data or write data input-output terminal;

a third switching element connected between a midpoint between the first switching element and second switching element and the serial-parallel converting means; and a switching control means to control ON/OFF of each of the switching elements according to a control signal fed from said memory controlling means.

* * * * *